United States Patent
Chang et al.

(10) Patent No.: US 9,356,012 B2
(45) Date of Patent: May 31, 2016

(54) HIGH VOLTAGE ESD PROTECTION APPARATUS

(75) Inventors: Yi-Feng Chang, Xinbei (TW); Jam-Wem Lee, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 499 days.

(21) Appl. No.: 13/243,688

(22) Filed: Sep. 23, 2011

(65) Prior Publication Data

US 2013/0075854 A1    Mar. 28, 2013

(51) Int. Cl.
*H01L 27/02*    (2006.01)

(52) U.S. Cl.
CPC ........ *H01L 27/0259* (2013.01); *H01L 27/0255* (2013.01)

(58) Field of Classification Search
CPC .................. H01L 27/0259; H01L 27/0255
USPC .......... 257/496, 487, 355–363, 173, 477, 557, 257/E27.023; 438/275
See application file for complete search history.

(56) References Cited

U.S. PATENT DOCUMENTS

| | | | |
|---|---|---|---|
| 5,689,133 A * | 11/1997 | Li et al. | 257/361 |
| 7,081,662 B1 * | 7/2006 | Lee et al. | 257/557 |
| 2007/0247213 A1 * | 10/2007 | Kapoor | 327/534 |
| 2009/0194838 A1 * | 8/2009 | Pendharkar et al. | 257/476 |
| 2010/0118454 A1 * | 5/2010 | Ker et al. | 361/56 |
| 2011/0127602 A1 * | 6/2011 | Mallikarjunaswamy | 257/331 |
| 2012/0256229 A1 * | 10/2012 | Chen | 257/139 |

* cited by examiner

*Primary Examiner* — Zandra Smith
*Assistant Examiner* — Lauren R Bell
(74) *Attorney, Agent, or Firm* — Slater Matsil, LLP

(57) ABSTRACT

An ESD protection apparatus comprises a metal contact formed on the emitter of a transistor. The metal contact has a different conductivity type from the emitter. In addition, the metal contact and the emitter of the transistor form a diode connected in series with the transistor. The diode connected in series with the transistor provides extra headroom for the breakdown voltage of the ESD protection apparatus.

17 Claims, 7 Drawing Sheets

HIGH VOLTAGE ESD PROTECTION APPARATUS

BACKGROUND

Electrostatic discharge (ESD) is a rapid discharge that flows between two objects due to the build-up of static charge. ESD may destroy semiconductor devices because the rapid discharge can produce a relatively large current. In order to reduce the semiconductor failures due to ESD, ESD protection circuits have been developed to provide a current discharge path. When an ESD event occurs, the discharge current is conducted through the discharge path without going through the internal circuits to be protected.

In the semiconductor technology, ESD protection solutions such as NMOS transistors, Silicon-Controlled Rectifiers (SCRs) and RC triggered PMOS transistors are widely used. Each ESD protection device may comprise a detection circuit and an ESD current discharge path. For example, an RC triggered ESD protection circuit may comprise a discharge transistor, a driver and an ESD spike detection circuit. The ESD spike detection circuit may include a resistance element and a capacitance element connected in series to form an RC detection circuit. The node between the resistance element and the capacitance element is coupled to the gate of the discharge transistor via the driver. The time constant formed by the resistance element and the capacitance element is so chosen that the discharge transistor is turned off when the ESD protection device operates in a normal power up mode. On the other hand, the discharge transistor is turned on when an ESD spike occurs at a power bus to which the ESD protection circuit is coupled. The turn-on of the discharge transistor may provide a bypass of the ESD current from the power bus to ground so as to clamp the voltage of the power bus to a level below the maximum rating voltage to which the internal circuit is specified, so that it helps to prevent the large voltage spike from damaging the internal circuits being protected.

Similarly, a PNP transistor can be used as an ESD protection device. More particularly, the emitter of the PNP transistor is coupled to an input/output (I/O) pad of an integrated circuit and the collector of the PNP transistor is coupled to ground. When an ESD event occurs, an external voltage across the I/O pad and ground increases beyond the reverse-bias breakdown voltage of the PNP transistor. As a result, a conductive path is established between the emitter and the collector of the PNP transistor. Such a conductive path allows the large amount of ESD energy to be discharged in a relatively short amount of time. As a consequence, the internal circuit components of the integrated circuit can be protected from being damaged by the ESD event.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an NPN transistor based electrostatic discharge (ESD) protection device. The invention may also be applied, however, to a variety of ESD protection devices.

Figure 1:
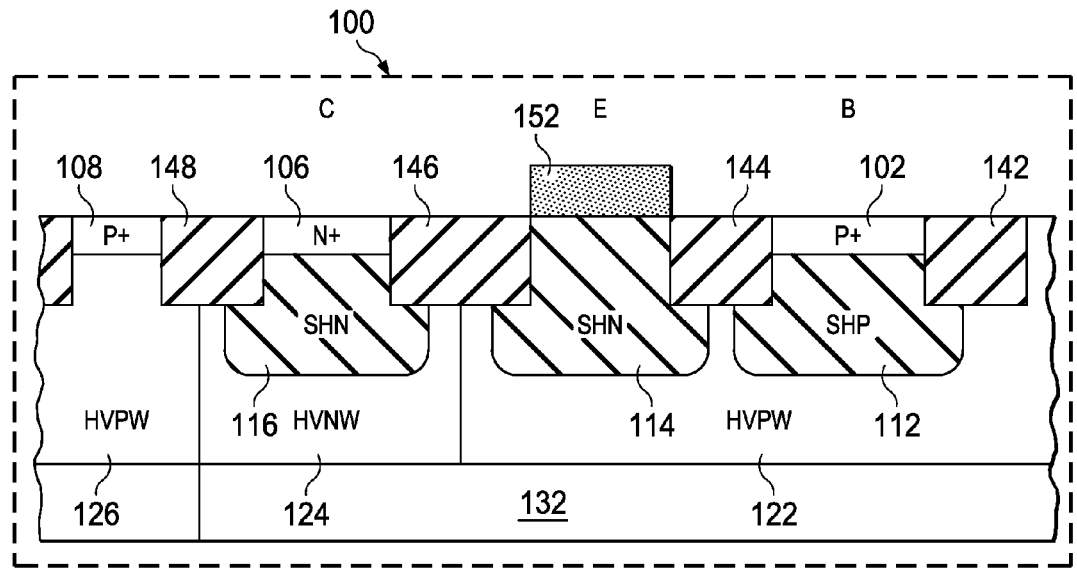
FIG. 1 illustrates a simplified cross-sectional view of an ESD protection structure in accordance with an embodiment.

FIG. 1 illustrates a simplified cross-sectional view of an ESD protection structure in accordance with an embodiment. The ESD protection structure 100 includes a first P+ region 102, a second P+ region 108, a first N+ region 106, a first isolation region 142, a second isolation region 144, a third isolation region 146 and a fourth isolation region 148. The ESD protection structure 100 further comprises a shallow p-type well 112 and shallow n-type well 114 and 116. For simplicity, throughout the description, the shallow p-type well 112 and the shallow n-type well 114 and 116 are alternatively referred to as a SHP region 112, a first SHN region 114 and a second SHN region 116 respectively. In one embodiment, the SHP region 112, the first SHN region 114 and the second SHN region 116 have a depth of about 1 µm.

The ESD protection structure 100 further comprises a first high voltage P well (HVPW) region 122, a high voltage N well (HVNW) region 124 and a second HVPW region 126. As shown in FIG. 1, both the first HVPW region 122 and the HVNW region 124 are formed on an N+ buried layer (NBL) 132. The NBL 132 is commonly used in the art, and hence is not discussed in further detail. Both the SHP region 112 and the first SHN region 114 are formed in the HVPW 122. More particularly, as shown in FIG. 1, an upper portion of the SHP region 112 and an upper portion of the first SHN region 114 are separated by the second isolation region 144. A bottom portion of the SHP region 112 and a bottom portion of the first SHN region 114 are enclosed by the HVPW region 122. Likewise, the second SHP region 116 has an upper portion formed between the third isolation region 146 and the fourth isolation region 148 and a bottom portion enclosed by the HVNW region 124.

The first P+ region 102 is formed on the SHP region 112. The first P+ region 102 is separated from the first SHN region 114 by the second isolation region 144. The N+ region 106 is formed on the second SHN region 116. The second P+ region 108 is formed on the second HVPW 126. As shown in FIG. 1, the N+ region 106 is separated from the first SHN region 114 by the third isolation region 146. In addition, the N+ region 106 is separated from the second P+ region 108 by the fourth isolation region 148.

In FIG. 1, there may be a p-type metal contact 152 formed on the first SHN region 114. As a result, the p-type metal contact 152 and the first SHN region 114 form a diode junction. Such a diode junction helps to increase the breakdown voltage of the ESD protection device 100. The detailed explanation of the p-type metal contact 152 will be described below with respect to FIG. 2 and FIG. 3. In accordance with an embodiment, the p-type metal contact 152 comprises cobalt silicide ($CoSi_2$). It should be noted that while FIG. 1 illustrates a p-type metal contact 152 formed on the first SHN 114, one skilled in the art will recognize that other metal contacts are necessary for the first P+ region 102 and the N+ region 106. Indeed, the metal contacts on the first P+ region 102 and the N+ region 106 are semiconductor contacts that form low resistance connections between the ESD protection device 100 and external terminals (not shown).

The SHP region 112, the first SHN region 114 and the second SHN region 116 are fabricated in a low voltage CMOS process. In accordance with an embodiment, the SHP region 112, the first SHN region 114 and the second SHN region 116 are fabricated in a 5V CMOS process. It should further be noted that while the SHP region 112, the first SHN region 114 and the second SHN region 116 appear to be similar in FIG. 1, one person skilled in the art will recognize that it is merely an example. The SHP region 112, the first SHN region 114 and the second SHN region 116 may have unequal dimensions or doping concentrations.

In accordance with an embodiment, the first P+ region 102, the second P+ region 108 and the N+ region 106 are highly doped. The first P+ region 102, the second P+ region 108 and the N+ region 106 have a doping density of between about $10^{20}$ /cm$^3$ and $10^{21}$ /cm$^3$. In addition, the SHP region 112, the first SHN region 114 and the second SHN region 116 are heavily doped regions. The SHP region 112 has a doping density of between about $10^{17}$ /cm$^3$ and $10^{18}$ /cm$^3$. The first SHN region 114 and the second SHN region 116 have a doping density of between about $10^{17}$ /cm$^3$ and $10^{18}$ /cm$^3$. Furthermore, in accordance with an embodiment, the first HVPW region 122 has a doping density of about $10^{17}$ /cm$^3$. Likewise, the HVNW region 124 and the second HVPW region 126 have a doping density of $10^{17}$ /cm$^3$.

It should be noted that the doping technique used in the previous example is selected purely for demonstration purposes and is not intended to limit the various embodiments to any particular doping technique. One skilled in the art will recognize that alternate embodiment could be employed (such as employing the diffusion technique).

The isolation regions 142, 144, 146 and 148 are used to isolate active regions so as to prevent leakage current from flowing between adjacent active regions. The isolation region (e.g., the first isolation region 142) can be formed by various ways (e.g., thermally grown, deposited) and materials (e.g., silicon oxide, silicon nitride). In accordance with an embodiment, the isolation regions (e.g., the first isolation region 142) may be fabricated by a surface trench isolation (STI) technique.

In accordance with an embodiment, the ESD protection structure 100 may comprise two depletion regions. A first depletion region is formed between the HVNW region 124 and the first HVPW region 122. One skilled in the art will recognize that the first depletion region can provide a breakdown voltage when the first depletion region is reverse biased during an ESD event. The detailed operation of the breakdown voltage of the ESD protection structure 100 will be described below with respect to FIG. 2 and FIG. 3. In addition, a second depletion region is formed between the p-type metal contact 152 and the first SHN region 114. Since the second depletion region is connected in series with the first depletion region, the second depletion region may provide additional breakdown voltage protection.

In FIG. 1, the ESD protection structure 100 may provide an on-chip ESD protection solution. For ESD protection applications, the N+ region 106 is typically coupled to an input/output (I/O) pad and the p-type metal contact 152 is typically coupled to a VSS pad, which is typically grounded or coupled to a power supply. An advantageous feature of the described embodiment is that the second depletion region formed by the p-type metal contact 152 and the first SHN region 114 provides extra ESD protection headroom as well as reliable protection.

Figure 2:
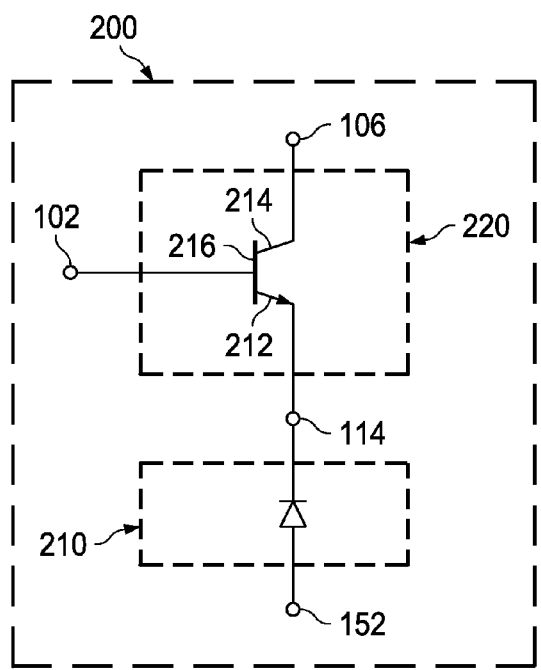
FIG. 2 illustrates an equivalent circuit diagram of the ESD protection structure illustrated in FIG. 1.

FIG. 2 illustrates an equivalent circuit diagram of the ESD protection structure illustrated in FIG. 1. The equivalent circuit of the ESD protection structure 100 illustrated in FIG. 1 includes a diode 210 and an NPN transistor 220. Referring again to FIG. 1, the p-type metal contact 152 is formed on the first SHN region 114. The junction between the p-type metal contact 152 and the first SHN region 114 forms the diode 210 as shown in FIG. 2. The diode 210 has a cathode and an anode. The cathode is located in the first SHN region 114. The anode is located in the p-type metal contact 152. In accordance with an embodiment, the diode 210 has a typical breakdown voltage of 10V. However, as one of ordinary skill in the art will recognize that the diode 210 and its associated semiconductor structure is merely exemplary and is not intended to limit various embodiments in any fashion. By selecting different diffusion parameters, any suitable breakdown voltage rating may be utilized in the ESD protection circuit described above.

The NPN transistor 220 has an emitter 212, a base 216 and a collector 214. The emitter 212, the base 216 and the collector 214 are formed by the first SHN region 114, the first P+ region 102 and the N+ region 106 respectively. The emitter 212 is electrically coupled to the cathode of the diode 210. The base 216 is either coupled to the emitter 212 or floating. In sum, a simplified circuit diagram 200 depicts that the corresponding circuit of the ESD protection structure 100 is formed by a series connection of the diode 210 and the NPN transistor 220.

However, it should be recognized that while FIG. 2 illustrates the ESD protection circuit with one diode and one NPN transistor (e.g., diode 210 and NPN transistor 220), the ESD protection circuit could accommodate any numbers of diodes and NPN transistors. Furthermore, it is understood that the ESD protection circuit may be implemented using a plurality of diodes or NPN transistors in series connection. On the other hand, other configurations of a plurality of diodes and NPN transistors such as parallel-connected diodes coupled to parallel-connected NPN transistors are also within the contemplated scope of this embodiment.

As known in the art, the NPN transistor 220 has a breakdown voltage. When a large voltage spike is applied between the collector 214 and the emitter 212, the NPN transistor 220 may experience an avalanche breakdown in which a large current is allowed to flow from the collector 214 to the emitter 212. The current path from the collector 214 to the emitter 212 may provide a bypass of the ESD current and clamp the voltage between the collector 214 and the emitter 212 to a level below the maximum rating voltage of the internal circuit, so that it helps to prevent the large voltage spike from damaging the internal circuits being protected. Similarly, the diode 210 has a breakdown voltage (e.g., 10V) when a voltage is applied between the cathode and the anode of the diode 210. In sum, the ESD protection circuit 200 has a breakdown voltage equivalent to the NPN transistor's 220 breakdown voltage plus the diode's 210 breakdown voltage.

Figure 12:
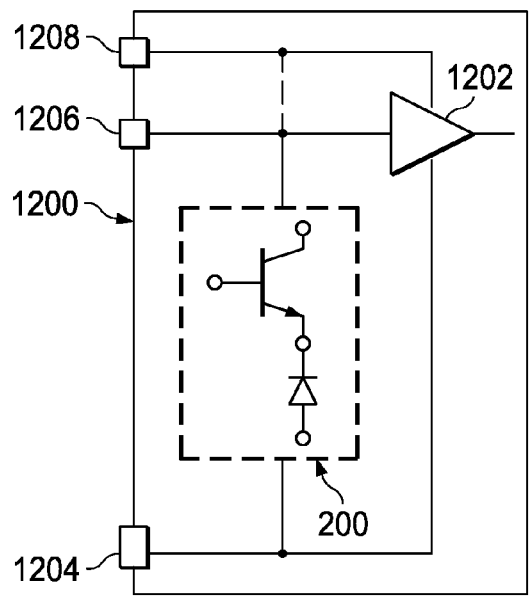
FIG. 12 illustrates an integrated circuit level ESD protection diagram in accordance with an embodiment.

The ESD protection circuit 200 is typically placed at an I/O pad and a VSS of a device to be protected (not shown but illustrated in FIG. 12). The first N+ region 106 is typically coupled to the I/O pad and the p-type metal contact 152 is typically coupled to the VSS, which is typically grounded. If an ESD event occurs, a voltage spike is applied between the first N+ region 106 and the p-type metal contact 152. Firstly, both the diode 210 and the NPN transistor 220 experience the voltage spike, which may exceed the breakdown voltages of the diode 210 and the NPN transistor 220. In response to the voltage spike, the NPN transistor 220 may enter an avalanche conduction mode. Consequently, the NPN transistor 220 may provide a current path so that the ESD discharge current can flow from the collector 214 to the emitter 212.

Furthermore, the diode 210 allows the ESD current to flow from the cathode to the anode when the voltage across the cathode and the anode exceeds the breakdown voltage of the diode 210 (e.g., 10V). In addition, the diode 210 may clamp the voltage between the cathode and the anode to its breakdown voltage (e.g., 10V). The conduction of both the diode 210 and the NPN transistor 220 clamps the voltage between the collector 214 and the anode of the diode 210 to a lower level so that the internal circuits coupled to the collector 214 can be protected.

It should be noted that both the diode 210 and the NPN transistor 220 may turn on nearly simultaneously. However, for convenience the description above uses a slightly earlier turn-on of the NPN transistor 220 as an example to describe the breakdown mechanism. It is understood that the turn-on sequence between the diode 210 and the NPN transistor 220 plays no role in this embodiment. The breakdowns of two series-connected elements (e.g., diode 210 and NPN transistor 220) in the ESD protection circuit 200 may be performed in any arbitrary sequence. However, the specifically discussed example above is preferred.

Figure 3:
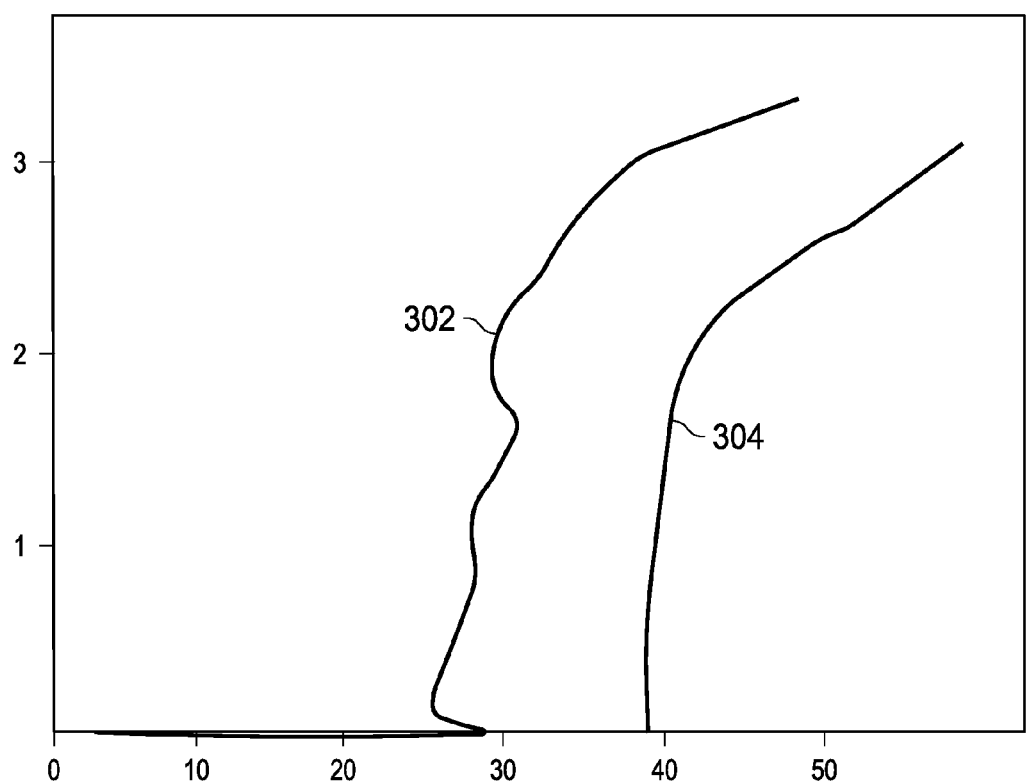
FIG. 3 illustrates breakdown voltage curves of a conventional ESD protection circuit such as a PNP transistor and the ESD protection circuit in FIG. 2.

FIG. 3 illustrates the breakdown voltage curves of a conventional ESD protection circuit such as a PNP transistor and the ESD protection circuit 200 in FIG. 2. The horizontal axis of FIG. 3 represents the ESD voltage across an ESD protection circuit (e.g., the ESD protection circuit 200). The vertical axis of FIG. 3 represents the ESD current flowing through the ESD protection circuit. A curve 302 illustrates the current flowing through a conventional ESD protection circuit as a voltage spike is applied. As shown in FIG. 3, the trigger voltage as well as the breakdown voltage for a conventional ESD protection circuit is around 30V. On the curve 302, before the applied voltage reaches the trigger voltage, the ESD current is approximately equal to zero. Once the applied ESD voltage exceeds the trigger voltage, the ESD current increases in proportion to the applied ESD voltage. In this embodiment, the peak ESD current of the conventional ESD protection circuit is up to about 3 A with a breakdown voltage approximately 30V.

The curve 304 represents the I-V relationship for the ESD protection circuit 200 during an ESD event. As shown in FIG. 3, the trigger voltage as well as the breakdown voltage of the ESD protection circuit 200 is about 40V. After a resulting breakdown, the curve 304 is about in parallel with the curve 302 but having a voltage gap, which is about 10V as illustrated in FIG. 3. An advantageous feature of the described embodiment is that the diode 210 helps to provide a higher ESD breakdown voltage.

Figure 4:
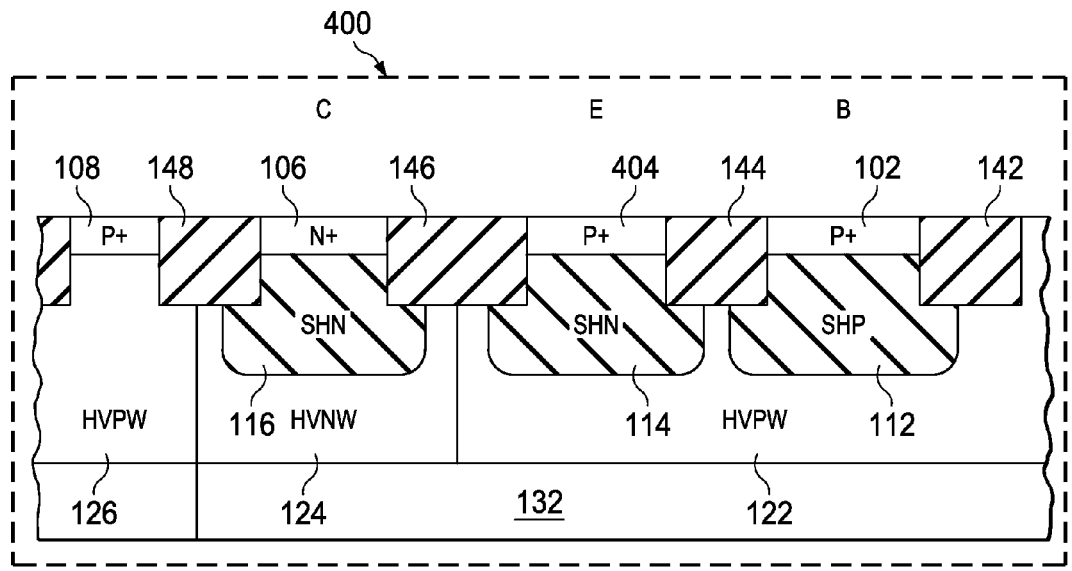
FIG. 4 illustrates a simplified cross-sectional view of an ESD protection structure in accordance with another embodiment.
Figure 5:
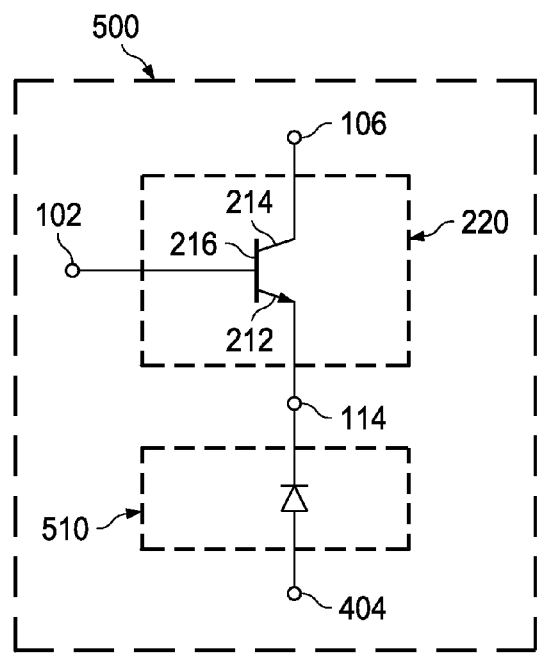
FIG. 5 illustrates an equivalent circuit diagram of the ESD protection structure illustrated in FIG. 4.

FIG. 4 illustrates a simplified cross-sectional view of an ESD protection structure in accordance with another embodiment. FIG. 4 is similar to FIG. 1, and hence is not discussed in detail to avoid unnecessary repetition. In comparison with FIG. 1, a third P+ region 404 is formed on the first SHN region 114. As a result, a second depletion region is formed by the third P+ region 404 and the first SHN region 114. Similar to the second depletion region formed by a p-type metal contact 152 and the first SHN region 114 in FIG. 1, the second depletion region in FIG. 4 can provide addition breakdown voltage protection. FIG. 5 illustrates an equivalent circuit diagram of the ESD protection structure 400 illustrated in FIG. 4. As shown in FIG. 5, the equivalent circuit diagram of the ESD protection structure 400 is similar to that shown in FIG. 2, and hence is not discussed in further detail to avoid unnecessary repetition.

Figure 6:
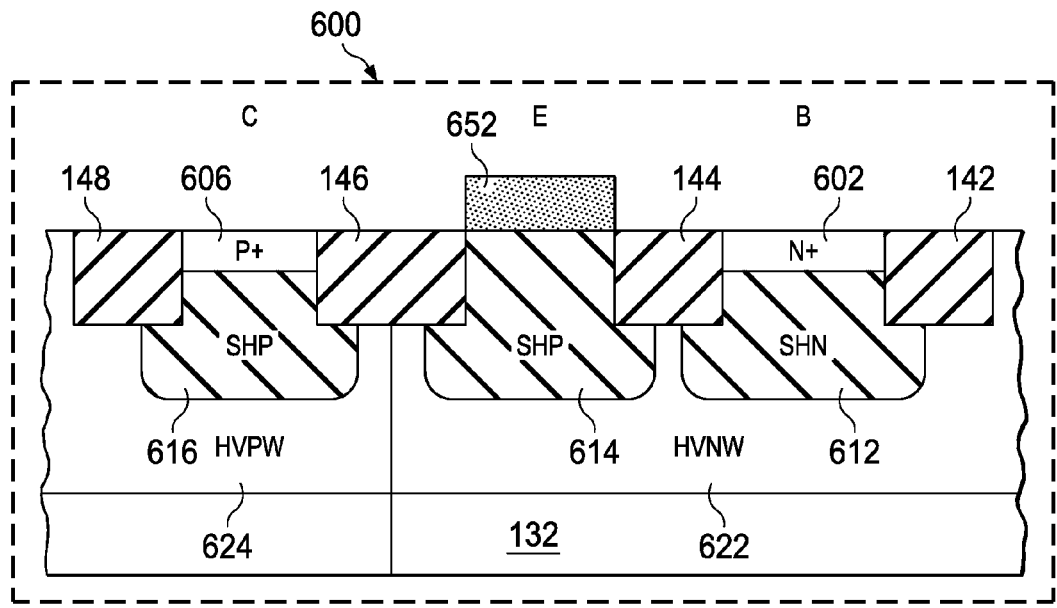
FIG. 6 illustrates a simplified cross-sectional view of an ESD protection structure in accordance with yet another embodiment.

FIG. 6 illustrates a simplified cross-sectional view of an ESD protection structure in accordance with yet another embodiment. The structure configuration of FIG. 6 is similar to FIG. 1 except that FIG. 6 comprises a PNP transistor rather than an NPN transistor. In comparison with FIG. 1, each p-type region is replaced by its corresponding n-type region. Likewise, each n-type region is replaced by its corresponding p-type region. The operation principles of the PNP transistor based ESD protection structure 600 is similar to its NPN transistor based counterpart shown in FIG. 1, and hence are not discussed in detail to avoid repetition.

It should be noted that in FIG. 6 the metal contact 652 is an n-type metal contact. In accordance with an embodiment, the n-type metal contact 652 may be formed of Titanium Nitride (TiN). As shown in FIG. 6, the n-type metal contact 652 is formed on the first SHP region 614. As a result, a second depletion region is formed by the n-type metal contact 652 and the first SHP region 614. Similar to the second depletion region formed by a p-type metal contact 152 and the first SHN region 114 in FIG. 1, the second depletion region in FIG. 6 can provide extra headroom during an ESD event.

Figure 7:
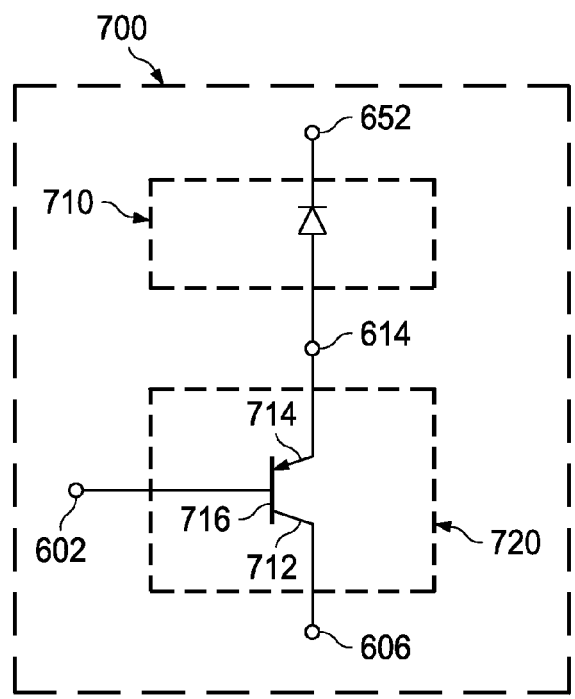
FIG. 7 illustrates an equivalent circuit diagram of the ESD protection structure illustrated in FIG. 6.

FIG. 7 illustrates an equivalent circuit diagram of the ESD protection structure 600 illustrated in FIG. 6. As shown in FIG. 7, the equivalent circuit diagram of the ESD protection structure 600 comprises a diode 710 connected in series with a PNP transistor 720. During an ESD event, the operation principle of the equivalent circuit diagram 700 is similar to that of the equivalent circuit diagram 200 shown in FIG. 2, and hence is not discussed in detail herein.

Figure 8:
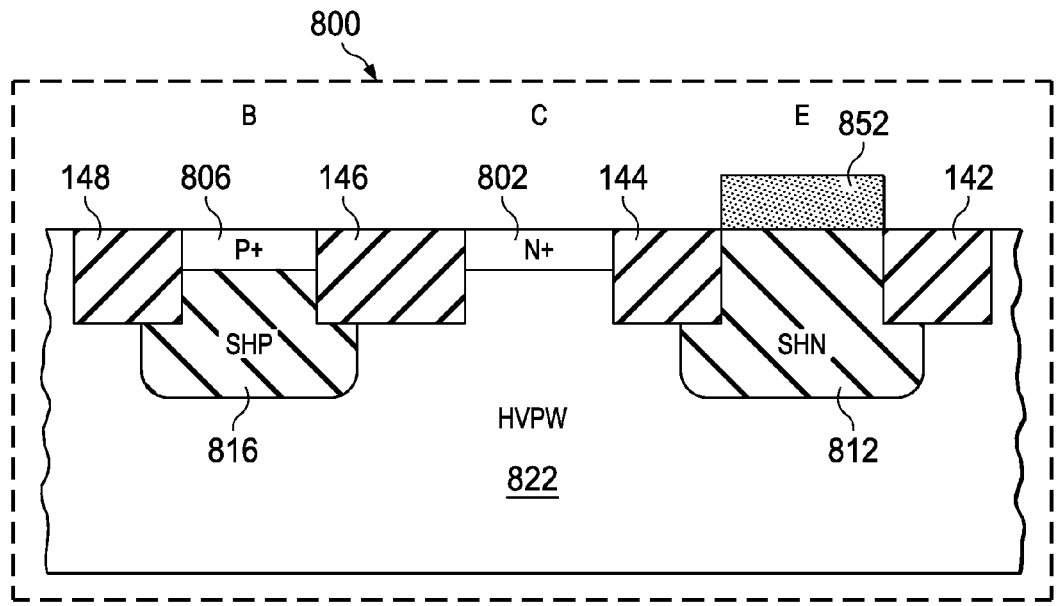
FIG. 8 illustrates a simplified cross-sectional view of an ESD protection structure in accordance with yet another embodiment.

FIG. 8 illustrates a simplified cross-sectional view of an ESD protection structure 800 in accordance with yet another embodiment. The ESD protection structure 100 includes a P+ region 806, an N+ region 802, a SHP region 816, a SHN region 812 and an HVPW region 822. Both the SHP region 816 and the SHN region 812 are formed in the HVPW 822. More particularly, as shown in FIG. 8, an upper portion of the SHP region 816 is formed between the third isolation region 146 and the fourth isolation region 148. An upper portion of the SHN region 812 is formed between the first isolation region 142 and the second isolation region 144. A bottom portion of the SHP region 816 and a bottom portion of the SHN region 812 are enclosed by the HVPW 822. The P+ region 806 is formed on the SHP region 816. The N+ region 802 is formed on the HVPW region 822. The N+ region 802 is separated from the SHN region 812 by the second isolation region 144. The N+ region 802 is separated from the P+ region 806 by the third isolation region 146.

In FIG. 8, there may be a p-type metal contact 852 formed on the SHN region 812. As a result, the p-type metal contact 852 and the SHN region 812 form a diode junction. Such a diode junction helps to increase the breakdown voltage of the ESD protection device 800. In accordance with an embodiment, the p-type metal contact 852 comprises $CoSi_2$. The SHP region 816 and the SHN region 812 are similar to the SHP region and the SHN region in FIG. 1, and hence are not discussed in further detail herein.

In accordance with an embodiment, the ESD protection structure 800 may comprises two depletion regions. A first depletion region is formed between the N+ region 802 and the HVPW region 822. One skilled in the art will recognize that the first depletion region can provide a breakdown voltage when the first depletion region is reverse biased during an ESD event. In addition, a second depletion region is formed between the p-type metal contact 852 and the SHN region 812. Since the second depletion region is connected in series with the first depletion region, the second depletion region may provide additional breakdown voltage during an ESD event.

Figure 9:
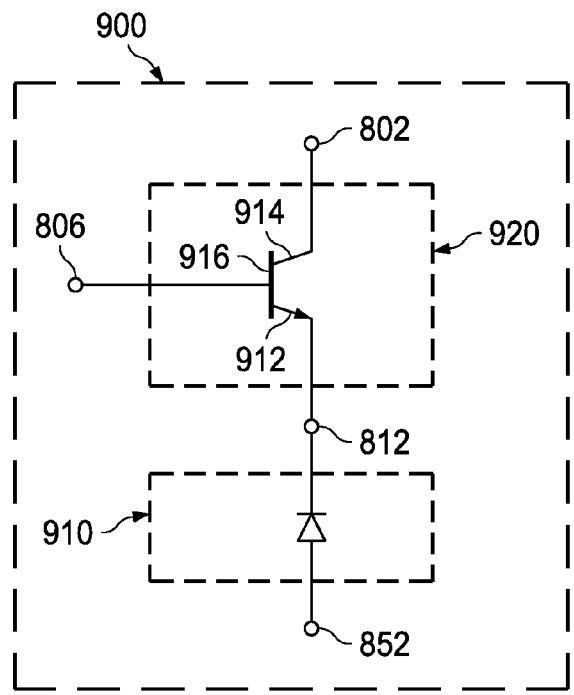
FIG. 9 illustrates an equivalent circuit diagram of the ESD protection structure illustrated in FIG. 8.

FIG. 9 illustrates an equivalent circuit diagram of the ESD protection structure 800 illustrated in FIG. 8. As shown in FIG. 9, the equivalent circuit diagram of the ESD protection structure 900 comprises a diode 910 connected in series with an NPN transistor 920. During an ESD event, the operation principle of the equivalent circuit diagram 900 is similar to that of the equivalent circuit diagram 200 shown in FIG. 2, and hence is not discussed in detail herein.

Figure 10:
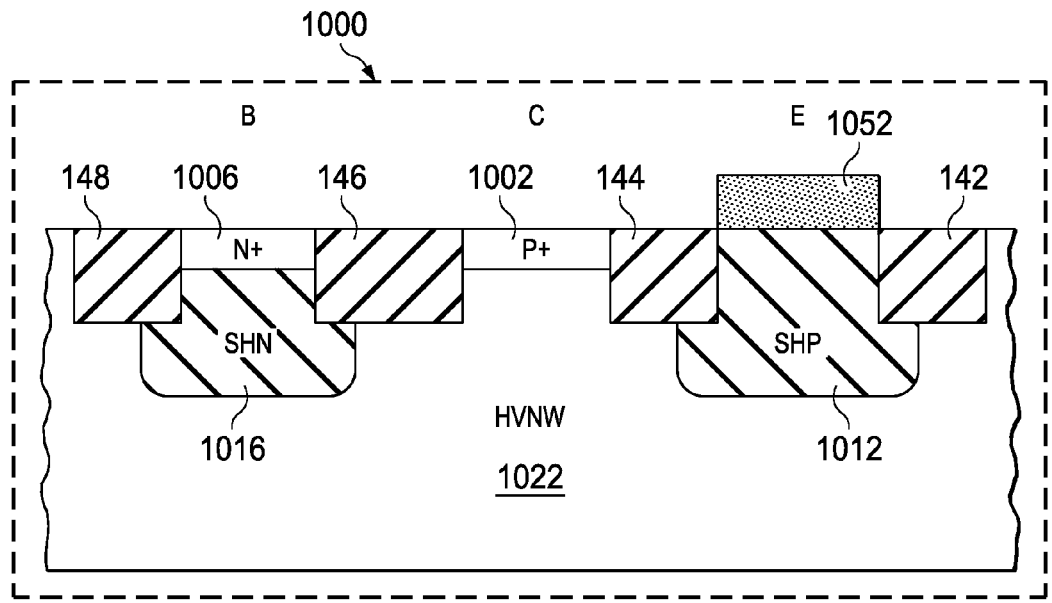
FIG. 10 illustrates a simplified cross-sectional view of an ESD protection structure in accordance with yet another embodiment.

FIG. 10 illustrates a simplified cross-sectional view of an ESD protection structure in accordance with yet another embodiment. The structure configuration of FIG. 10 is similar to FIG. 8 except that FIG. 10 comprises a PNP transistor rather than an NPN resistor. In comparison with FIG. 8, each p-type region is replaced by its corresponding n-type region. Likewise, each n-type region is replaced by its corresponding p-type region. The operation principles of the PNP transistor based ESD protection structure 1000 is similar to its NPN transistor based counterpart 800 shown in FIG. 8, and hence are not discussed in further detail herein.

It should be noted that in FIG. 10 the metal contact 1052 is an n-type metal contact. In accordance with an embodiment, the metal contact 1052 may be formed of TiN. As shown in FIG. 10, the n-type metal contact 1052 is formed on the SHP region 1012. As a result, a second depletion region is formed by the n-type metal contact 1052 and the SHP region 1012. Similar to the second depletion region formed by a p-type metal contact 852 and the SHN region 812 in FIG. 8, the second depletion region in FIG. 10 can provide extra headroom during an ESD event.

Figure 11:
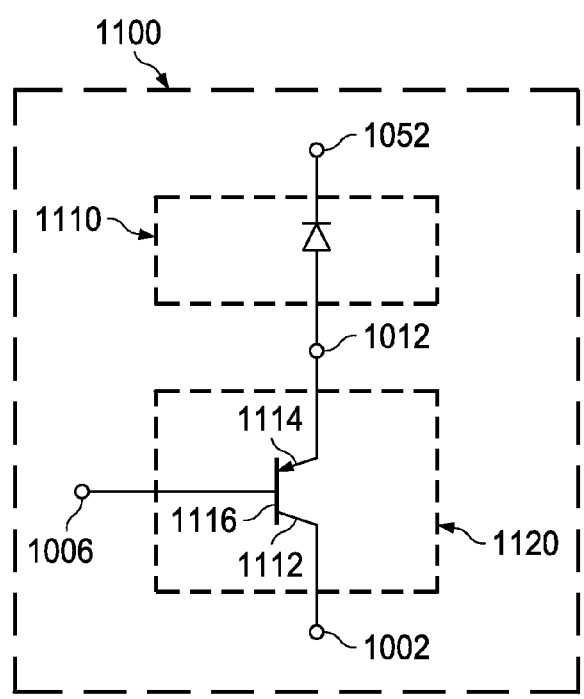
FIG. 11 illustrates an equivalent circuit diagram of the ESD protection structure illustrated in FIG. 10.

FIG. 11 illustrates an equivalent circuit diagram of the ESD protection structure 1000 illustrated in FIG. 10. As shown in FIG. 11, the equivalent circuit diagram of the ESD protection structure 1100 comprises a diode 1110 connected in series with a PNP transistor 1120. During an ESD event, the operation principle of the equivalent circuit diagram 1100 is similar to that of the equivalent circuit diagram 200 shown in FIG. 2, and hence is not discussed in detail herein.

FIG. 12 illustrates an integrated circuit level ESD protection diagram in accordance with embodiment. An integrated circuit chip 1200 has a VDD pad 1208, an I/O pad 1206 and a VSS pad 1204. Internal circuits 1202 are coupled to the VDD pad 1208 and VSS pad 1204. The internal circuits 1202 further include an input coupled to the I/O pad 1206. The ESD protection circuit 200 is coupled between the I/O pad 1206 and the VSS pad 1204. It should be noted that the ESD protection circuit 200 is provided for illustrative purpose only. The ESD protection circuit between the I/O pad 1206 and the VSS pad 1204 may comprise any variations of the ESD protection circuits 200 shown in FIG. 2. For example, the ESD protection circuit may be any of the ESD protection circuits 500, 700, 900 and 1100 shown in FIG. 5, FIG. 7, FIG. 9 and FIG. 11 respectively.

When an ESD event occurs between the I/O pad 1206 and the VSS pad 1204, the ESD protection circuit 200 conducts the ESD current, and the turn-on of an ESD protection circuit (e.g., the ESD protection circuit 200) clamps the voltage between the I/O pad 1206 and the VSS pad 1204 below the maximum voltage to which the internal circuits 1202 are specified, so that the internal circuits 1202 coupled between the I/O pad 1206 and the VSS pad 1204 are protected. An advantageous feature of the described circuit level ESD protection is the ESD protection circuit provides a bypass for ESD current to flow so that the various circuit components of the internal circuit 1202 are protected.

It should be noted that the ESD protection circuit 200 may be coupled between the VDD pad 1208 and the VSS pad 1204 as indicated by the dashed line in FIG. 12. When an ESD event occurs between the VDD pad 1208 and the VSS pad 1204, the conduction of the ESD protection circuit clamps the voltage between the VDD pad 1208 and the VSS pad 1204, so that the internal circuits such as internal circuits 1202 are protected. In short, the connection of the ESD device 200 in FIG. 12 is merely an example, which should not unduly limit the scope of the claims. One skilled in the art will recognize many variations, alternatives, and modifications. For example, the ESD protection circuit 200 may comprise a plurality of NPN transistors connected in series.

Figure 13:
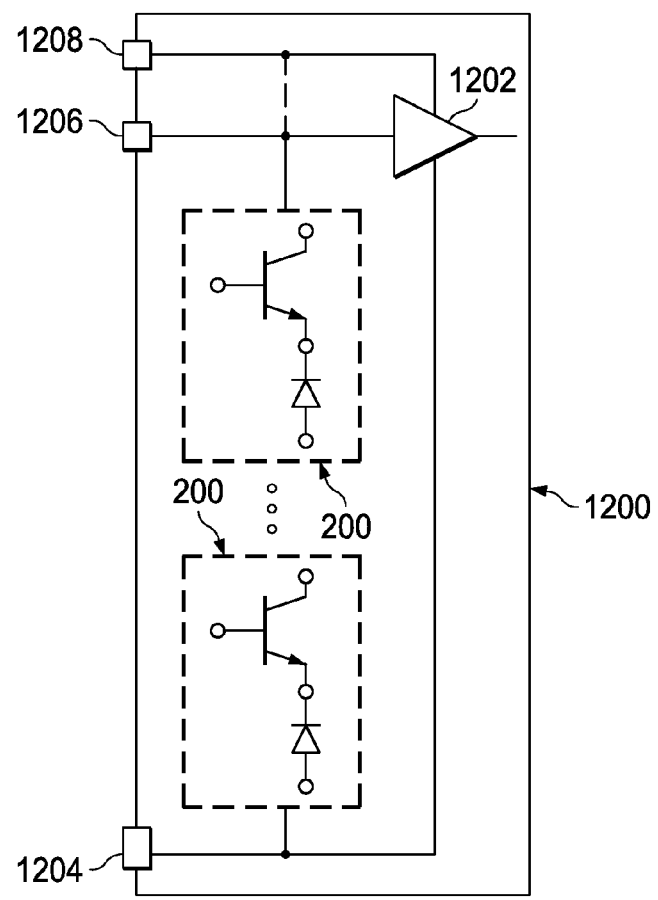
FIG. 13 illustrates a further ESD protection scheme by employing a plurality of ESD protection circuits in series connection between an I/O pad and a VSS pad.

FIG. 13 illustrates a further ESD protection scheme by employing a plurality of ESD protection circuits in series connection between an I/O pad and a VSS pad. Similar to FIG. 12, FIG. 13 includes an integrated circuit 1200, a VDD pad 1208, an I/O pad 1206, a VSS pad 1204 and internal circuits 1202. However, FIG. 13 further includes a series connection of ESD protection circuits electrically coupled to the I/O pad 1206 and the VSS pad 1204. In high voltage applications, a single ESD protection circuit such as the ESD protection circuit 200 shown in FIG. 13 may not provide a reliable ESD protection. By contrast, a plurality of ESD protection circuits 200 connected in series may provide an adjustable ESD protection breakdown voltage as well as an adjustable ESD protection current. As shown in FIG. 13, the ESD protection circuits 200 connected in series are substantially identical. It should be noted that "substantially identical" means the same design but could be different from each other due to fabrication process variations.

In FIG. 13, if an ESD event occurs, a voltage spike is applied between the I/O pad 1206 and the VSS pad 1204. The series-connected ESD protection circuits may turn on nearly simultaneously. Each ESD protection circuit provides an ESD protection breakdown voltage. The sum of all series-connected ESD protection circuits' breakdown voltages clamps the I/O pad's voltage 1206 to a level below the maximum rating voltage of the internal circuits 1202, so that the internal circuits 1202 are protected.

As described above with respect to FIG. 12, placing an ESD device (e.g., ESD protection device 200) between the I/O pad 1206 and the VSS pad 1204 in FIG. 13 is merely an example. One skilled in the art will recognize many variations, alternatives, and modifications, such as connecting the ESD device between the VDD pad 1208 and the VSS pad 1204 as indicated by the dashed line in FIG. 13.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
   an NPN transistor comprising a collector, a base and an emitter, wherein:
   the collector is formed by a N+ region;
   the base is formed by a first P+ region, a low voltage p well with a first doping density and a high voltage p well with a second doping density, wherein the first doping density is substantially higher than the second doping density and the low voltage p well is a shallow p well; and
   the emitter is formed by a first low voltage n well, wherein the first low voltage n well is a first shallow n well; and
   a diode formed by a p-type region and the first low voltage n well, wherein
   the p-type region is formed on the first low voltage n well, and wherein a bottommost surface of the p-type region is in direct contact with a topmost surface of the first low voltage n well; and wherein
   the diode and the NPN transistor are connected in series.

2. The apparatus of claim 1, wherein the p-type region is a p-type metal contact formed on the first low voltage n well, wherein the diode is formed by the p-type metal contact and the first low voltage n well.

3. The apparatus of claim 1, wherein the p-type region is a second P+ region formed in the emitter, wherein the second P+ region and the first low voltage n well form the diode.

4. The apparatus of claim 1, wherein the collector further comprises:
   a second low voltage n well, wherein the second low voltage n well is a second shallow n well; and
   a high voltage n well, wherein
   the second low voltage n well is formed on the high voltage n well; and
   the N+ region is formed on the second low voltage n well.

5. The apparatus of claim 4, further comprising:
   a first depletion region formed by the high voltage n well and the high voltage p well; and
   a second depletion region formed by the first low voltage n well and the p-type region.

6. The apparatus of claim 4, further comprising a first isolation region, a second isolation region, a third isolation region and a fourth isolation region, wherein:
   the first P+ region is formed between the first isolation region and the second isolation region;
   an upper portion of the low voltage p well is formed between the first isolation region and the second isolation region;
   an upper portion of the first low voltage n well is formed between the second isolation region and the third isolation region;
   the N+ region is formed between the third isolation region and the fourth isolation region; and
   an upper portion of the second low voltage n well is formed between the third isolation region and the fourth isolation region.

7. A device comprising:
   a PNP transistor comprising a collector, a base and an emitter, wherein:
   the collector is formed by a P+ region;
   the base is formed by a first N+ region, a low voltage n well with a first doping density and a high voltage n well with a second doping density, wherein the first doping density is substantially higher than the second doping density and the low voltage n well is a shallow n well; and
   the emitter is formed by a first low voltage p well, wherein the first low voltage p well is a first shallow p well;
   a diode formed by an n-type region and the first low voltage p well, wherein
   the n-type region is formed on the first low voltage p well, and wherein a bottommost surface of the n-type region is in direct contact with a topmost surface of the first low voltage p well; and
   the diode and the PNP transistor are connected in series.

8. The device of claim 7, wherein the n-type region is an n-type metal contact formed on the first low voltage p well, wherein the diode is formed by the n-type metal contact and the first low voltage p well.

9. The device of claim 7, wherein the n-type region is a second N+ region formed in the emitter, wherein the second N+ region and the first low voltage p well form the diode.

10. The device of claim 7, wherein the collector further comprises:
    a second low voltage p well, wherein the second low voltage p well is a second shallow p well; and
    a high voltage p well, wherein
    the second low voltage p well is formed on the high voltage n well; and
    the P+ region is formed on the second low voltage p well.

11. The device of claim 10, further comprising:
    a first depletion region formed by the high voltage n well and the high voltage p well; and
    a second depletion region formed by the first low voltage p well and the n-type region.

12. The device of claim 10, further comprising a first isolation region, a second isolation region, a third isolation region and a fourth isolation region, wherein:
    the first N+ region is formed between the first isolation region and the second isolation region;
    an upper portion of the low voltage n well is formed between the first isolation region and the second isolation region;
    an upper portion of the first low voltage p well is formed between the second isolation region and the third isolation region;

the P+ region is formed between the third isolation region and the fourth isolation region; and an upper portion of the second low voltage p well is formed between the third isolation region and the fourth isolation region.

13. A circuit comprising:

an input and output (I/O) terminal; and a first electrostatic discharge protection device comprising a diode formed by a metal contact and an emitter of a transistor, wherein a bottommost surface of the metal contact is in direct contact with a topmost surface of the emitter, and wherein a first edge of the metal contact is vertically aligned with a sidewall of a first isolation region and a second edge of the metal contact is vertically aligned with a sidewall of a second isolation region, and wherein an upper portion of the emitter is between the first isolation region and the second isolation region; and the transistor having a collector formed by a P+ region, a base formed by a first N+ region, a low voltage n well with a first doping density and a high voltage n well with a second doping density, wherein the first doping density is substantially higher than the second doping density and the emitter formed by a first low voltage p well, wherein the first low voltage p well is a first shallow p well, wherein the diode and the transistor are connected in series; and wherein the diode and the transistor are coupled between the I/O terminal and ground, and wherein the low voltage n well is a shallow n well.

14. The circuit of claim 13, where the transistor is a PNP transistor having the emitter coupled to an anode of the diode.

15. The circuit of claim 13, further comprising a second electrostatic discharge protection device, wherein:

the second electrostatic discharge protection device has a substantially identical structure as the first electrostatic discharge device; and the second electrostatic discharge protection device and the first electrostatic discharge protection device are connected in series between the I/O terminal and ground.

16. The circuit of claim 13, wherein the first electrostatic discharge protection device comprises:

a first depletion region formed by the high voltage n well and a high voltage p well; and a second depletion region formed by the metal contact and the emitter of the transistor.

17. The circuit of claim 16, wherein the second depletion region provides a second breakdown voltage for the first electrostatic discharge protection device.

* * * * *